United States Patent [19]

Mori et al.

[11] Patent Number: 5,759,912

[45] Date of Patent: *Jun. 2, 1998

[54] METHOD OF MANUFACTURING A SEMICONDUCTOR DEVICE HAVING MULTI-LAYERED WIRING WITHOUT HILLOCKS AT THE INSULATING LAYERS

[75] Inventors: Kazuya Mori, Yokohama; Kenichi Otsuka, Kawasaki, both of Japan

[73] Assignee: Kabushiki Kaisha Toshiba, Kawasaki, Japan

[*] Notice: The term of this patent shall not extend beyond the expiration date of Pat. No. 5,498,571.

[21] Appl. No.: 653,904

[22] Filed: May 28, 1996

Related U.S. Application Data

[62] Division of Ser. No. 461,769, Jun. 5, 1995, abandoned, which is a continuation of Ser. No. 198,779, Feb. 18, 1994, abandoned.

[30] Foreign Application Priority Data

Apr. 13, 1993 [JP] Japan .................. 5-086082

[51] Int. Cl.⁶ .................. H01L 21/4763
[52] U.S. Cl. .................. 438/624; 438/631; 438/637; 438/688; 438/937
[58] Field of Search .................. 257/77, 741, 750, 257/758, 765, 771, 767; 437/187, 189, 194, 195, 197, 198, 199, DIG. 957; 438/624, 631, 637, 688, 685, 686, 687, 937

[56] References Cited

U.S. PATENT DOCUMENTS

| | | | |
|---|---|---|---|
| 4,735,662 | 4/1988 | Szabo et al. | 136/256 |
| 4,826,786 | 5/1989 | Merenda et al. | 437/195 |
| 4,962,060 | 10/1990 | Sliwa et al. | 257/767 |
| 4,988,423 | 1/1991 | Yamamoto et al. | 204/192.17 |
| 5,148,259 | 9/1992 | Kato et al. | 257/771 |
| 5,290,733 | 3/1994 | Hayasaka et al. | 437/194 |
| 5,306,665 | 4/1994 | Manabe | 437/189 |
| 5,332,693 | 7/1994 | Kim | 437/194 |
| 5,407,532 | 4/1995 | Fang et al. | 156/656 |
| 5,424,246 | 6/1995 | Matsuo et al. | 437/192 |
| 5,432,128 | 7/1995 | Tsu | 437/194 |
| 5,538,921 | 7/1996 | Obeng | 437/190 |
| 5,591,677 | 1/1997 | Jeng | 437/195 |

FOREIGN PATENT DOCUMENTS

| | | | |
|---|---|---|---|
| 1-5035 | 1/1989 | Japan | 437/197 |
| 1-45142 | 2/1989 | Japan | 257/767 |
| 3-262126 | 11/1991 | Japan | 437/197 |
| 5-144812 | 6/1993 | Japan | 437/197 |
| 5-315330 | 11/1993 | Japan | 437/187 |
| 6-112202 | 4/1994 | Japan | 437/187 |

*Primary Examiner*—Charles L. Bowers, Jr.
*Assistant Examiner*—Toniae M. Thomas
*Attorney, Agent, or Firm*—Finnegan, Henderson, Farabow, Garrett & Dunner, L.L.P.

[57] ABSTRACT

An Al alloy interconnection layer is deposited on a silicon oxide layer, and a first carbon layer is formed on the Al alloy interconnection layer. Then, the first carbon layer and the Al alloy interconnection layer are patterned, thereby forming a first interconnection layer consisting of the Al alloy interconnection layer and the first carbon layer. Sequentially, a second carbon layer is formed on the first interconnection layer and the silicon oxide layer. The second carbon layer is entirely etched by the RIE method, thereby leaving the second carbon layer only on side surfaces of the first interconnection layer. A high temperature layer made of $SiO_2$ is deposited on the second carbon layer and the silicon oxide layer. Thereafter, the high temperature layer is etched back until the first carbon layer is exposed, thus being flattened. An interlayer insulating layer is deposited on the high temperature layer and the first interconnection layer.

9 Claims, 1 Drawing Sheet

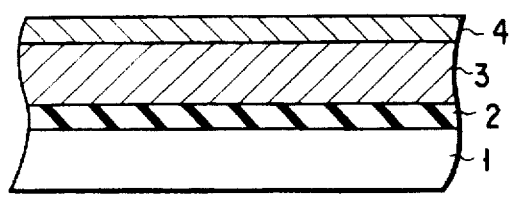
F I G. 1
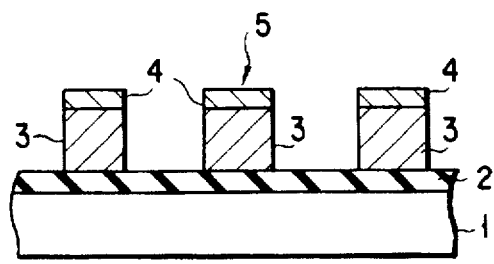
F I G. 2
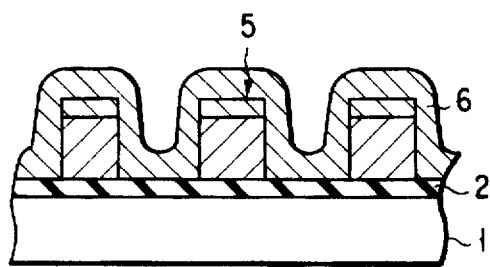
F I G. 3
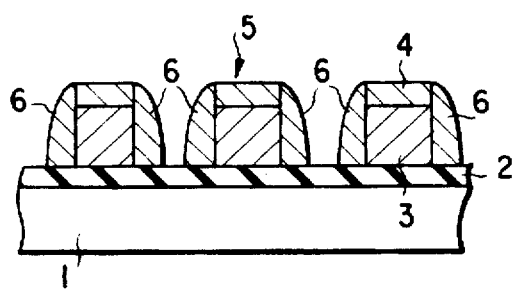
F I G. 4
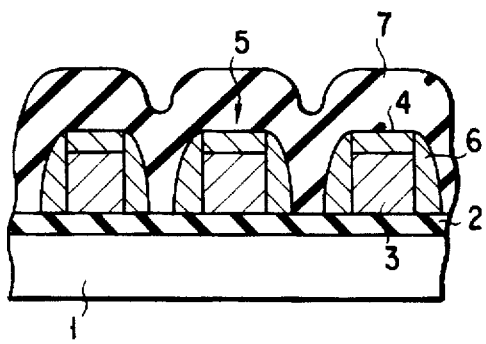
F I G. 5
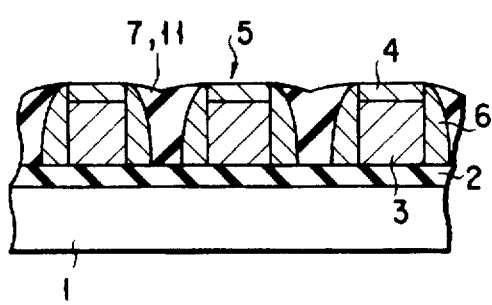
F I G. 6
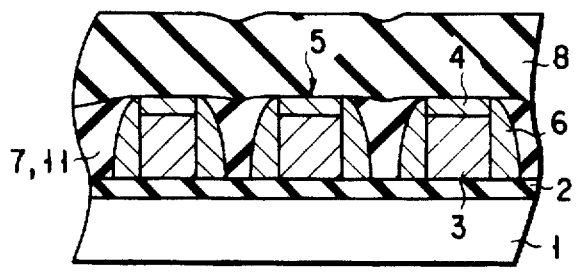
F I G. 7
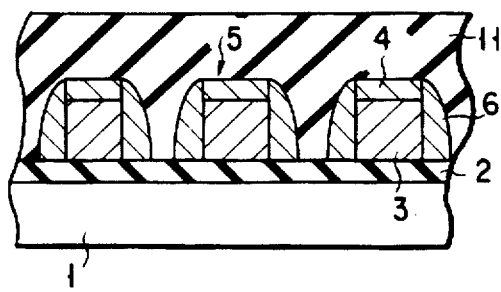
F I G. 8

METHOD OF MANUFACTURING A SEMICONDUCTOR DEVICE HAVING MULTI-LAYERED WIRING WITHOUT HILLOCKS AT THE INSULATING LAYERS

This application is a division of application Ser. No. 08/461,769, filed Jun. 5, 1995, now abandoned, which was a continuation of application Ser. No. 08/198,779, filed Feb. 18, 1994, now abandoned.

BACKGROUND OF THE INVENTION

1. Field of the Invention

This invention relates to a semiconductor device having reliable multi-layered wiring and a method of manufacturing the semiconductor device.

2. Description of the Related Art

Recently, LSIs have been highly integrated, and multi-layered wiring has been generally formed on a semiconductor substrate.

A method for manufacturing a conventional semiconductor device will be explained.

First, a first wiring layer made of an Al alloy is formed on a semiconductor substrate, and then an interlayer insulating layer is deposited on the first wiring layer. Subsequently, the interlayer insulating layer is flattened by the use of the etching-back method so as to prevent short-circuiting between wiring layers. A contact hole is formed in the interlayer insulating layer, and a second wiring layer made of an Al alloy is formed on the inner surface of the opening and on the interlayer insulating layer such that the second wiring layer is electrically connected to the first wiring layer.

In this conventional method, the higher the temperature during depositing the interlayer insulating layer, the lesser the concentration of an impurity (e.g. $H_2O$) contained in the layer. However, if the interlayer insulating layer is formed at a temperature higher than 350° C., hillocks will grow from the first wiring layer made of an Al alloy. Such hillocks more and more grow in a flattening process performed later, which may result in short-circuiting between the first and second wiring layers. To prevent the growth of the hillocks, there is a case where a $SiO_2$ layer with a thickness of about 2000 Å is formed on the first wiring layer at low temperature, and then a thick interlayer insulating layer is formed on the $SiO_2$ layer at high temperature so as to obtain a predetermined breakdown voltage. Since in this case, the $SiO_2$ layer formed at low temperature has low quality, a gas, such as $H_2O$ gas, is discharged from the $SiO_2$ layer after the contact hole is formed in the $SiO_2$ layer and the interlayer insulating layer to connect the first and second wiring layers to each other. The discharged gas inevitably degrades the reliability of contact between the first and second wiring layers.

Further, it is considered as another method for preventing the growth of the hillocks, to employ a liquid phase method using $H_2SiF_6$, in which an interlayer insulating layer made of $SiO_2$ is formed on the first wiring layer. In this case, however, if the first wiring layer made of an Al alloy is directly coated with $H_2SiF_6$, then the layer will be solved. Therefore, it is necessary to form an interlayer insulating layer with the use of the liquid phase method, after depositing a $SiO_2$ layer with a thickness of 1000–2000 Å on the first wiring layer by the CVD method. Thus, a large number of steps is required, and a large amount of dust will be generated during the steps.

In addition, in the interlayer-flattening step performed by the etching-back method, it is difficult to control the thickness of an etched portion of the interlayer insulating layer, and the first wiring layer may be exposed as a result of over-etching. At this time, hillocks grow from the first wiring layer, resulting in short-circuiting between the wiring layers. Therefore, the interlayer insulating layer cannot be completely flattened. Moreover, it is very difficult to form third and fourth wiring layers, and hence to produce an LSI with the third and fourth wiring layers.

SUMMARY OF THE INVENTION

It is the object of the invention to provide a semiconductor device having reliable multi-layered interconnection without hillocks which may grow at the time of forming an interlayer insulating layer; and a method of forming the semiconductor device.

According to an aspect of the invention, there is provided a semiconductor device comprising:

a conductive layer provided above a semiconductor substrate;

a first carbon layer formed on the conductive layer;

a second carbon layer formed on side surfaces of the conductive layer; and a flattened interlayer insulating layer formed between the first and second carbon layers.

According to another aspect of the invention, there is provided a method of manufacturing a semiconductor device, comprising the steps of:

depositing a conductive layer above a semiconductor substrate;

forming a first carbon layer on the conductive layer;

patterning the first carbon layer and the conductive layer, thereby forming a first interconnection layer which comprises the first carbon layer and the conductive layer;

forming a second carbon layer on side surfaces of the first interconnection layer; and depositing an interlayer insulating layer on the second carbon layer and the first interconnection layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

FIG. 1 is a cross sectional view, useful in explaining a step employed in semiconductor device-forming methods according to first and second embodiments;

FIG. 2 is a cross sectional view, useful in explaining a step following the step of FIG. 1 and employed in the semiconductor device-forming methods of the first and second embodiments;

FIG. 3 is a cross sectional view, useful in explaining a step following the step of FIG. 2 and employed in the semiconductor device-forming methods of the first and second embodiments;

FIG. 4 is a cross sectional view, useful in explaining a step following the step of FIG. 3 and employed in the semiconductor device-forming methods of the first and second embodiments;

FIG. 5 is a cross sectional view, useful in explaining a step following the step of FIG. 4 and employed in the semiconductor device-forming methods of the first and second embodiments;

FIG. 6 is a cross sectional view, useful in explaining a step following the step of FIG. 5 or FIG. 8 and employed in the semiconductor device-forming methods of the first and second embodiments;

FIG. 7 is a cross sectional view, useful in explaining a step following the step of FIG. 6 and employed in the semiconductor device-forming methods of the first and second embodiments; and FIG. 8 is a cross sectional view, useful in explaining a step following the step of FIG. 4 and employed in the semiconductor device-forming method of the second embodiment.

DETAILED DESCRIPTION OF THE PREFERRED EMBODIMENTS

The embodiments of the invention will be explained with reference to the accompanying drawings.

FIGS. 1–7 show a method of producing a semiconductor device according to a first embodiment of the invention. As is shown in FIG. 1, first, a silicon oxide layer 2 is formed on a silicon substrate 1. Then, a conductive layer with a thickness of about 8000 Å, for example, an Al alloy wiring layer 3, is formed on the silicon oxide layer 2. A first carbon layer 4 with a thickness of 300–1000 Å is formed on the Al alloy interconnection layer 3 by the sputtering method.

Then, as is shown in FIG. 2, the first carbon layer 4 and the Al alloy interconnection layer 3 are patterned, thereby forming on the silicon oxide layer 2 a first interconnection layer 5 consisting of the Al alloy interconnection layer 3 and the first carbon layer 4.

Subsequently, as is shown in FIG. 3, a second carbon layer 6 with a thickness of 500–2000 Å is formed on the first interconnection layer 5 and the silicon oxide layer 2.

As is shown in FIG. 4, the overall surface of the second carbon layer 6 is etched by the RIE (Reactive Ion Etching) method, thereby rendering the second carbon layer 6 to remain on side wall surfaces of the first interconnection layer 5.

Thereafter, as is shown in FIG. 5, a high temperature layer 7 made of $SiO_2$ and having a thickness of about 10000 Å is deposited at a high temperature on the second carbon layer 6, the first interconnection layer 5 and the silicon oxide layer 2.

Subsequently, as is shown in FIG. 6, the high temperature layer 7 is etched back until the first carbon layer 4 is exposed, thereby being flattened.

As is shown in FIG. 7, a flattened interlayer insulating layer 8 made of $SiO_2$ and having a thickness of 5000–10000 Å is deposited at a high temperature on the high temperature layer 7 and the first interconnection layer 5. Then, contact holes (not shown) are formed in those portions of the interlayer insulating layer 8 which are located on the first interconnection layer 5. A second interconnection layer (not shown) is formed on the inner surfaces of the contact holes and on the interlayer insulating layer 8.

Although the above-described first embodiment employs two-layered wiring comprising the first and second interconnection layers, it can employ muli-layered wiring comprising three layers or more.

As described above, in the first embodiment, the Al alloy interconnection layer 3 is deposited on the silicon oxide layer 2; the first carbon layer 4 is formed on the interconnection layer 3; and the first carbon layer 4 and the interconnection layer 3 are patterned, thereby forming the first interconnection layer 5 on the silicon oxide layer 2 and forming the second carbon layer 6 on side surfaces of the first interconnection layer 5. Thus, when the high temperature layer 7 containing no impurities such as $H_2O$, etc. has been deposited on the second carbon layer 6, the first interconnection layer 5 and the silicon oxide layer 2, the first and second carbon layers 4 and 6 prevent hillocks from growing from the Al alloy interconnection layer 3. In other words, even when the high temperature layer 7 has been deposited on the second carbon layer 6, the first interconnection layer 5 and the silicon oxide layer 2, no hillocks grow from the Al alloy interconnection layer 3, and hence the reliability of the multi-layered interconnection is enhanced.

Further, since the Al alloy interconnection layer 3 is coated with the first and second carbon layers 4 and 6, it is not necessary to employ such a double structure as employed in the conventional case, in which an interlayer insulating layer is formed after a $SiO_2$ layer is formed at a low temperature so as to restrain the growth of hillocks during the flattening process using the etching-back method.

Moreover, in the embodiment, the high temperature layer 7 is flattened by etching back it until the first carbon layer 4 is exposed. Since the first carbon layer 4 is formed on the Al alloy interconnection layer 3, the Al alloy interconnection layer 3 is prevented from being exposed even when the etching-back is excessively performed. Accordingly, no hillocks grow from the interconnection layer 3, and short-circuiting does not occur between the interconnection layers. As a result, multi-layered interconnection having three layers or more can easily be formed, and the reliability of the multi-layered interconnection be enhanced.

In addition, in the case of the conventional semiconductor device manufacturing method, when an interlayer insulating layer is formed at a temperature of 350° C. or more, it is formed while a first interconnection layer made of an Al alloy is expanded; with the result that the first interconnection layer inevitably has a residual stress, after the interlayer insulating layer is cooled. On the other hand, since in the above-described embodiment, the Al alloy interconnection layer 3 is coated with the first and second carbon layers 4 and 6, the thermal expansion of the interconnection layer 3 at the time of depositing the high temperature layer 7 can be minimized. Hence, the interconnection layer 3 has a low residual stress, and has a high resistance against stress migration.

Further, in the embodiment, the interlayer insulating layer 8 is deposited at a high temperature on the high temperature layer 7 and the first interconnection layer 5 so as to enhance the quality thereof; and then contact holes (not shown) are formed in those portions of the interlayer insulating layer 8 which are located on the first interconnection layer 5. Since the interlayer insulting layer 8 has good quality, discharge of a gas (e.g. $H_2O$ gas) is prevented. As a result, the first and second interconnection layers have good contact therebetween, thus enhancing the reliability of the multi-layered interconnection.

FIGS. 1–4 and 6–8 are cross sectional views, showing a semiconductor-manufacturing method according to a second embodiment of the invention. In these figures, elements similar to those employed in the first embodiment are denoted by corresponding reference numerals, and an explanation will be given of elements which are not employed in the first embodiment.

As is shown in FIG. 4, the second carbon layer 6 is formed on side surfaces of the first wiring layer 5.

Thereafter, as is shown in FIG. 8, a $SiO_2$ layer 11 is formed on the second carbon layer 6, the first wiring layer 5 and the silicon oxide layer 2 with the use of the liquid phase method.

Subsequently, as is shown in FIG. 6, the $SiO_2$ layer 11 is etched until the first carbon layer 4 is exposed. This is because the $SiO_2$ layer 11 formed by the liquid phase method does not have good quality, and hence if the layer 11 remains on the first carbon layer 4, it is difficult to form good contact holes for contacting the first wiring layer 5 in a process performed later. In other words, at the time of forming the contact holes, a gas such as $H_2O$ gas is discharged from the $SiO_2$ layer 11, which may cause corrosion in the vicinity of the holes, resulting in defective contact. To avoid this, those portions of the layer 11 which are located on the first carbon layer 4 are all etched. Thus, the $SiO_2$ layer 11 is flattened.

Thereafter, as is shown in FIG. 7, the interlayer insulating layer 8 is deposited on the layer 11 and the first wiring layer 5.

The second embodiment can provide an advantage similar to that of the first embodiment.

Furthermore, since the Al alloy wiring layer 3 is coated with the first and second carbon layers 4 and 6, it is not necessary, at the time of flattening the $SiO_2$ layer 11 formed by the liquid phase method, to form beforehand a thin oxide layer on the wiring layer 3 by the CVD method as in the conventional method. This being so, the method of the invention requires a relatively small number of steps, and a small amount of dust is generated during executing the method.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

depositing a conductive layer above a semiconductor substrate;

forming a first carbon layer on the conductive layer;

patterning the first carbon layer and the conductor layer, thereby forming a first interconnection layer which comprises the first carbon layer and the conductive layer;

forming a second carbon layer on side surfaces of the first interconnection layer;

depositing an interlayer insulating layer on the second carbon layer and the first interconnection layer;

etching the interlayer insulating layer to expose the first carbon layer; and depositing a flattened interlayer insulating layer on the interlayer insulating layer and the first carbon layer.

2. The method according to claim 1, wherein the first and second carbon layers prevent hillocks from growing from the conductive layer.

3. The method according to claim 1, wherein the interlayer insulating layer is deposited at a high temperature.

4. The method according to claim 1, wherein the conductive layer is made of an aluminum alloy.

5. The method according to claim 1, further comprising the step of forming contact holes in portions of the flattened interlayer insulating layer located above the first carbon layer.

6. A method of manufacturing a semiconductor device, comprising the steps of:

depositing a conductive layer above a semiconductor substrate;

forming a first carbon layer on the conductive layer;

patterning the first carbon layer and the conductor layer, thereby forming a first interconnection layer which comprises the first carbon layer and the conductive layer;

forming a second carbon layer on side surfaces of the first interconnection layer;

depositing an interlayer insulating layer on the second carbon layer and the first interconnection layer; and forming contact holes in portions of the interlayer insulating layer located above the first carbon layer.

7. The method according to claim 6, wherein the first and second carbon layers prevent hillocks from growing from the conductive layer.

8. The method according to claim 6, wherein the interlayer insulating layer is deposited at a high temperature.

9. The method according to claim 6, wherein the conductive layer is made of an aluminum alloy.

* * * * *

UNITED STATES PATENT AND TRADEMARK OFFICE
CERTIFICATE OF CORRECTION

PATENT NO. : 5,759,912
DATED : June 2, 1998
INVENTOR(S) : Kazuya MORI et al.

It is certified that error appears in the above-identified patent and that said Letters Patent is hereby corrected as shown below:

On the title page item [54], and column 1, line 4, delete

"AT THE INSULATING LAYERS".

Signed and Sealed this

Fourteenth Day of September, 1999

*Attest:*

Q. TODD DICKINSON

*Attesting Officer*    *Acting Commissioner of Patents and Trademarks*